United States Patent [19]

Katayama et al.

[11] Patent Number: 4,457,587
[45] Date of Patent: Jul. 3, 1984

[54] REFLECTOR AND METHOD FOR MANUFACTURING THE SAME

[75] Inventors: Shitomi Katayama; Hajime Shimabukuro, both of Yokohama; Sugurm Nomura, Chigasaki; Hiroyuki Kurita; Akira Ohno, both of Yokohoma; all of Japan

[73] Assignee: NHK Spring Co., Ltd., Yokohama, Japan

[21] Appl. No.: 333,282

[22] Filed: Dec. 22, 1981

[51] Int. Cl.³ .......................... G02B 5/08; B05D 5/06; B05D 3/04; B21D 39/00
[52] U.S. Cl. .................................. 350/288; 350/590; 427/166; 427/343; 427/344; 428/623; 428/624; 428/626; 428/631; 428/650; 428/450; 428/409; 428/701; 204/130
[58] Field of Search ...................... 350/288, 320, 590; 427/166, 343, 344; 428/623, 624, 626, 631, 650, 450, 409, 701, 913; 204/130

[56] References Cited

U.S. PATENT DOCUMENTS

| 4,358,507 | 11/1982 | Senaha et al. | 350/288 |
| 4,364,634 | 12/1982 | Ohno et al. | 350/288 |
| 4,379,196 | 4/1983 | Halper | 427/162 |

FOREIGN PATENT DOCUMENTS

| 50-40348 | 9/1975 | Japan | 350/288 |
| 52-10741 | 1/1977 | Japan | 350/320 |
| 54-97155 | 8/1979 | Japan | 350/320 |

Primary Examiner—Jon W. Henry

[57] ABSTRACT

A reflector includes a base body made of a metallic material having substantially the same ionization potential as that of aluminum. A reflecting layer made of aluminum is formed over one surface of the base body by vacuum deposition. A light-transmitting water-insoluble inorganic oxide layer is formed on the aluminum reflecting layer. The light-transmitting inorganic oxide layer has its micropores sealed by $H_2O$ a carboxylate of an iron family element having a low valence.

29 Claims, 5 Drawing Figures

REFLECTOR AND METHOD FOR MANUFACTURING THE SAME

BACKGROUND OF THE INVENTION

I. Field of the Invention

The present invention relates to a reflector and a method for manufacturing the same and, more particularly, to an aluminum reflector which has good resistance to corrosion and a method for manufacturing the same.

II. Description of the Prior Art

An aluminum reflector is conventionally used for a reflecting shade for illumination, a parabolic reflector and the like. This aluminum reflector is constituted by an aluminum reflecting layer supported by a base body made of, for example, aluminum. The aluminum reflecting layer is generally coated with a light-transmitting inorganic oxide layer in order to prevent it from being degraded by the outer atmosphere.

The aluminum reflector of this type has advantages of good hardness, resistance to abrasion, oil resistance, heat resistance and the like by the presence of the light-transmitting inorganic oxide layer. However, this aluminum reflector does not have good resistance to chemicals. Therefore, the aluminum reflector is degraded by carbon dioxide, nitrogen monoxide, nitrogen dioxide, sulfurous acid gas, ammonia or the like which are contained in the air, so that the aluminum reflector may not be used with a desired performance for a long period of time.

The conventional aluminum reflector has another drawback in that the aluminum constituting the reflecting layer and the base body may be dissolved and corroded when the reflector is immersed into an electrolyte solution together with a metal which has a substantially higher ionization tendency, although when present alone in the electrolyte solution, the reflector may not be dissolved and corroded.

SUMMARY OF THE INVENTION

It is an object of the present invention to provide a reflector which has high resistance to chemicals, and thus can be used for a long period of time with a desired performance.

It is another object of the present invention to provide an aluminum reflector which is not subject to corrosion and degradation even if it is immersed in an electrolyte solution together with a metal which has an ionization tendency higher than that of aluminum.

In order to achieve the above and other objects of the present invention, there is provided a reflector comprising a base body made of a metallic material having substantially the same ionization potential as that of aluminum; an aluminum reflecting layer vacuum-deposited on one surface of the base body directly or through a smoothing layer formed on the base body; a light-transmitting water-insoluble inorganic oxide layer vacuum-deposited directly on the reflecting layer; and a sealing agent comprising $H_2O$ or a carboxylate of an iron family element and sealing micropores of the inorganic oxide layer.

According to one aspect of the present invention, insulating layers cover side faces of at least the base body and the aluminum reflecting layer.

The present invention is based on the inventors' finding that the weak chemical resistance of the conventional aluminum reflector is inevitable because the protective inorganic oxide layer has, in view of its molecular arrangement, a low density—that is, the layer has a number of micropores—and a corrosive chemical may pass through the pores and reach the aluminum reflecting layer. That is, the inorganic oxide layer is either an amorphous layer or an unstable crystalline layer having a low density and thus a number of micropores if it is formed by vacuum deposition from an amorphous inorganic oxide and even from a crystalline inorganic oxide. According to the present invention, the micropores are sealed with a sealing agent to be described later.

DETAILED DESCRIPTION OF THE PREFERRED EMBODIMENTS

Figure 1:
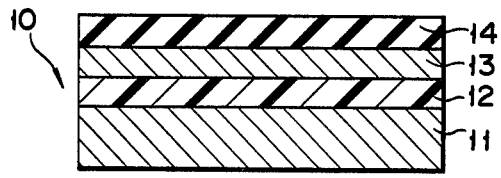
FIG. 1 is a sectional view illustrating the basic structure of a reflector according to the present invention.

The present invention will be described in detail with reference to the accompanying drawings. The same reference numerals denote the same parts.

FIG. 1 shows the basic structure of a reflector according to the present invention. Referring to FIG. 1, a reflector 10 has a support member, that is, a base body 11 which is made of a metallic material having substantially the same ionization potential as that of aluminum. The term "metallic material" having substantially the same ionization potential as that of aluminum is intended to mean those metals having an ionization potential equal to or lower than that of aluminum and yet higher than that of zinc, in the ionization series of K, Na, Ca, Mg, Al, Zn, Fe, Ni, Sn, Pb, (H), Cu, Hg, Ag, Pt, and Au. The metallic material of this type may be selected from aluminum, and an aluminum alloy such as alloys of aluminum with copper, manganese, silicon, magnesium or zinc, and with magnesium and silicon.

One surface of the base body 11 is cleaned by an appropriate method, and further may be smoothed as needed. Cleaning may be performed by a known method, such as cleaning with an acid or an alkali, treatment with an oxidizing agent or a reducing agent, or electrolysis. Smoothing can be performed by a buff-polishing or chemical polishing.

A smoothing layer 12 is formed on the cleaned surface of the base body 11 as needed (i.e., when the surface of the base body 11 is not smoothed). The smoothing layer 12 may be formed by coating and hardening or baking an inorganic compound paint which can withstand vacuum deposition to be described later, as an enamel or silicon oxide paint, or a high polymer paint which can withstand vacuum deposition, such as a polycarbonate paint, a polyallylcarbonate paint, an epoxy paint, a polyimide paint, a polysiloxane paint or the like.

An aluminum layer 13 which constitutes a reflecting layer is formed on the surface of the smoothing layer 12 (or it may be formed directly on the base body 11 when the base body 11 is smoothed) by vacuum deposition. The term "vacuum deposition" as used herein is intended to mean a method wherein a desired material (aluminum in this embodiment) is vaporized or ionized under reduced pressure to be deposited on a substrate (the base body 11 or the smoothing layer 12 in this embodiment) and includes well known methods such as vapor deposition, ion plating, sputtering or the like. The aluminum reflecting layer 13 is formed to a thickness of, preferably, 500 to 2,000 Å.

A light-transmitting water-insoluble inorganic oxide layer 14 which constitutes a protective layer for the reflecting layer 13 is formed on the surface of the aluminum reflecting layer 13 by vacuum deposition. The protective layer 14 is formed by vacuum-depositing a silicon oxide compound such as silicon dioxide, silicon monoxide or glasses; a single ceramic such as aluminum oxide, magnesium oxide, zirconium oxide, indium oxide or tin oxide; or a compound ceramic such as pyroceram, lithia ceramic or spinel. The protective layer 14 is formed to a thickness of, preferably, 0.5 to 5 μm.

The protective layer 14 as vacuum-deposited has low resistance to chemicals since a number of micropores are present therein as described above. The protective layer 14 is treated with a sealing agent. The sealing agent includes $H_2O$ or a carboxylate of an iron family element of low valence (that is, Fe (II), Co (II) or Ni (II)). The carboxylate is a water-soluble iron family metal salt of alkylcarboxylic acid, hydroxyalkylcarboxylic acid, aralkylcarboxylic acid, hydroxyaralkylcarboxylic acid, cycloalkylcarboxylic acid, hydroxycyclocarboxylic acid, or a mixture thereof. Examples of the carboxylate used in the present invention includes acetate, propionate, lactate, citrate, tartarate or a mixture thereof. The metal salts of nonvolatile carboxylic acid, such as lactate, citrate, tartarate and the like are very stable and are particularly suitable for sealing at high tempera- tures.

In order to seal the micropores of the protective layer 14 using the carboxylate, the protective layer 14 is sprayed with or immersed in an aqueous solution of the carboxylate under the normal atmospheric pressure or a higher pressure and at a temperature of 0 to 200° C. (without boiling) for 1 second to 1 hour. The simplest method is that the protective layer 14 is immersed in the aqueous solution at room temperature to a temperature of 100° C. under the ambient pressure. The aqueous solution may contain the carboxylate at the saturation concentration. However, in general, the concentration of the carboxylate is preferably 5 to 30%. When the concentration of the carboxylate is low, the treatment requires more time. Preferably, a corresponding free carboxylic acid is dissolved in the aqueous solution, because if the carboxylic acid used is volatile, the acid component may be lost due to evaporation so that the iron family metal ion of low valence in the solution is changed to an ion of high valence, thus disabling the sealing effect.

In order to perform the sealing at high speed, an intermediate product of the reflector which is not treated with the sealing agent is immersed in the aqueous solution of the carboxylate, and electrolysis is performed using the base body as a cathode and a piece of metal as an anode which is the same kind of metal as that of the carboxylate used. In this case, the electrolytic conditions may vary dependent on the type and concentration of the aqueous solution, the thickness of the base body, or the like. However, it is preferable that the electrolysis be performed with a voltage of 10 V or less and a current density of 500 mA/cm² or less for a few seconds to 1 hour.

Further, the sealing of the micropores of the protective layer can be effected by using boiling water or water vapor. In such cases, the sealing is conducted under the conditions (temperature and/or time) such that the protective layer is not peeled off the reflecting layer and yet the sealing is accomplished. Specifically, the protective layer is immersed in boiling water at a pH of 5 - 9 for a period of time within 20 minutes, preferably 5 minutes, under a temperature of 95° C. or more. Alternatively, the protective layer is treated with saturated water vapor at 100° C. for 5 to 20 minutes, at 150° C. for 2 to 10 minutes, or at 200° C. for 1 to 5 minutes, for example. The maximum vapor temperature is 200° C.

After the protective layer has its micropores sealed, it is sufficiently washed with water and dried to prepare a reflector product of the present invention. The sealing mechanism by the carboxylate is not clear. However, it is assumed that the carboxylate passes through the micropores of the protective layer 14 and reaches the surface of the aluminum reflecting layer 13 so that the carboxylate reacts with aluminum on the uppermost layer of the aluminum reflecting layer 13 to form a chelate, and the volume of the carboxylate increases to seal the micropores. $H_2O$ enters the micropores and react with the inorganic oxide to form a hydrate therewith, thus increasing the volume of the oxide layer and sealing the micropores.

A reflector of FIG. 1 thus made has a protective layer whose micropores are sealed and is highly resistant to chemicals. Further, when the reflector is immersed in an electrolyte solution, it is not corroded if present alone in the solution. But it may be corroded if a different metal of a higher ionization potential than that of aluminum is present in the solution because a partial cell may be formed between the aluminum layer or the base body and the different metal since the peripheral sides of the reflector are exposed.

In order to avoid the partial cell formation, the peripheral side faces of at least the base body 11 and the aluminum reflecting layer 13 are preferably coated with insulating layers. These insulating layers may be made of the materials as described with reference to the smoothing layer 12. The embodiments of the reflectors including the insulating layer are shown in FIGS. 2 to 5. These embodiments are the same except that the insulating layers cover the peripheral sides of different parts.

Figure 2:
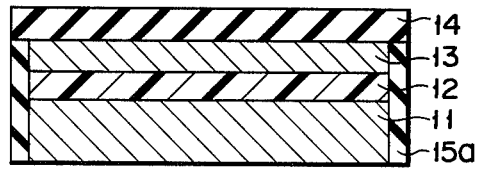
FIGS. 2 to 5 are sectional views of other embodiments of the reflector according to the present invention.

FIG. 2 shows a structure in which an insulating layer 15a covers the peripheral sides of the base body 11, the smoothing layer 12 and the reflecting layer 13, respectively. In order to form this structure, the smoothing layer 12 and the reflecting layer 13 are formed and the insulating layer 15a is then formed. Finally, the protective layer 14 is formed and sealing is performed. To manufacture the reflector in this method some measures must be taken. First, the insulating layer 15a must be made of a material which can withstand the vacuum deposition to be performed, that is, a material which has heat resistance and which contains little, if any, volatile solvent or the like. Second, the insulating layer 15a must be formed under manufacturing conditions such that the surface reflectivity of the aluminum reflecting layer 13 is not lowered much, and the insulating layer 15a must be formed within a predetermined period of time to maintain a predetermined reflectivity.

Figure 3:
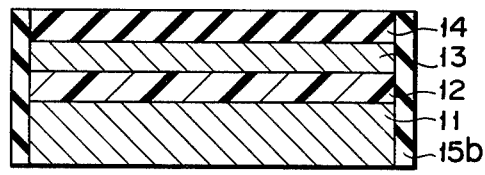

FIG. 3 shows a structure in which an insulating layer 15b covers the peripheral side faces of the base body 11, the smooth layer 12, the reflecting layer 13 and the protective layer 14. With this structure, resistance to corrosion is much improved as compared with the structure shown in FIG. 2. The protective layer 14 can be formed immediately after the aluminum reflecting layer 13 is formed, so that degradation of the reflectivity of the aluminum reflecting layer 13 due to oxidation and contaminations is prevented. In order to accomplish this structure, the insulating layer 15b is formed after the micropores of the protective layer 14 are sealed with the sealing agent (Method A). Alternatively, the insulating layer 15b is first formed, and the protective layer 14 is formed and its micropores are sealed with the sealing agent (Method B). According to Method (A), the peripheral side faces of the aluminum reflecting layer 13 are permeated slightly by the sealing agent, and the insulating layer 15b must be formed after sufficient washing and drying has been performed. According to Method (B), problems occurring in Method (A) do not occur, so that Method (B) is preferred to Method (A).

Figure 4:
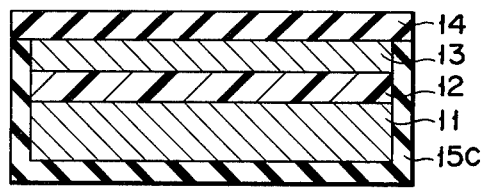

FIG. 4 shows a structure in which an insulating layer 15c also covers the other surface (bottom surface) of the base body 11 for the structure of FIG. 2.

Figure 5:
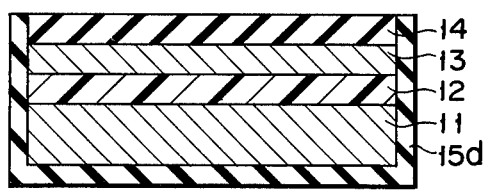

FIG. 5 shows a structure in which an insulating layer 15d also covers the other surface (bottom surface) of the base body 11 for the structure of FIG. 3.

In the structures shown in FIGS. 4 and 5, the insulating layer covers all the exposed faces of the base body 11 so that corrosion resistance of the base body 11 is greatly improved. However, when the reflecting mirror is adhered to another support, the structures shown in FIGS. 2 and 3 are preferable for better adhesion.

As described above, since the protective layer of the reflector of the present invention has its micropores sealed by the sealing agent, the reflecting mirror has strong resistance to acid, alkali and salts. When the reflector according to the present invention is immersed alone in an electrolyte solution, it is little corroded. The reflector having the insulating layer is not corroded even when immersed in an electrolyte solution together with another metal. The reflector of the invention also has good reflectivity (a specific reflectance of 80% or more). Therefore, the reflector according to the present invention can be used with a predetermined performance for a long period of time for a parabolic reflector for a solar plant, a reflector for air-conditioning and hot-water supply for family and business use, a reflecting shade for illumination equipment, a reflecting mirror and a heat-collecting mirror for a copying machine, a lightweight mirror, a reflecting mirror for interior decoration, a reflecting mirror for automobile headlights, and the like.

Examples of the present invention will be described below.

EXAMPLE 1

On the surface of an aluminum plate of 0.8 mm thickness which was degreased and pickled, was applied a mixed solution in which 2 parts of a 25% xylene solution of a curing agent consisting of nickel acetate and ethylene diamide in the mixing ratio of 1:1 were mixed with 100 parts of a 60% xylene solution of a phenylmethylsilicone resin containing 83.6 mol % of phenyl group. The applied solution was dried in air. The aluminum plate was then heated at 130° C. for 5 hours and then at 230° C. for 15 hours to cure the resin. The smoothing layer was thus formed.

Aluminum was vapor-deposited on the smoothing layer to a thickness of 1,500 Å and silicon dioxide was then deposited thereon to a thickness of 1.5µ to form the reflecting layer and the protective layer, respectively.

The intermediate product of the reflector was thus prepared.

The intermediate product was immersed in an aqueous sealing agent solution obtained by adding 100 ml of distilled water to 100 ml of a saturated aqueous solution of nickel (II) acetate for 30 minutes to seal the micropores of the protective layer. The intermediate product was removed from the aqueous solution of the sealing agent, washed with distilled water, and dried with air to obtain a desired reflector.

On the protective layer of the thus obtained reflector was dripped a 15% aqueous solution of hydrochloric acid or a 15% aqueous solution of sodium hydroxide. The reflecting mirror was left to stand for 30 minutes, washed with water and dried with air. Then, to evaluate the bonding between the protective layer and the reflecting layer, a test was conducted. A cellophane tape with an adhesive layer on it was put on the protective layer and peeled therefrom (cellophane tape test). No fragments of the protective layer were sticked to the cellophane tape.

Comparative Example 1

In order to prepare a reflector, the same procedure was repeated as in Example 1, except that sealing was not performed. The same test was conducted on the reflector as in Example 1. The reflecting layer was slightly corroded by the hydrochloric acid and the reflecting layer treated with the sodium hydroxide solution was entirely peeled off the reflecting layer.

EXAMPLE 2

The same procedure was repeated as in Example 1, except that the sealing agent solution was obtained by adding 100 ml of distilled water to 400 ml of a saturated aqueous soltuion of cobalt (II) acetate to prepare a desired reflector. When the same test was performed as in Example 1, the protective layer was not peeled off.

EXAMPLE 3

The same intermediate product as in Example 1 was prepared. The intermediate product was immersed in a solution obtained by adding 100 ml of distilled water to 400 ml of a saturated aqueous solution of nickel (II) acetate, and electrolysis was conducted using the base body as the cathode and a nickel plate as the anode. The electrolysis was performed for 30 minutes at a voltage of 2 to 4 V and a current density of 0.1 to 0.15 mA/cm$^2$.

The obtained reflector was not corroded by hydrochloric acid or sodium hydroxide.

EXAMPLE 4

A phenylmethyl silicone smoothing layer was formed on an aluminum plate in the same manner as in Example 1. Aluminum was coated on the smoothing layer to a thickness of 1,900 Å, and sapphire was coated thereover to a thickness of 1.5µ by vacuum deposition to form the reflecting layer and the protective layer, respectively. Thus, an intermediate product was obtained. The intermediate product was immersed in a solution obtained by adding 100 ml distilled water to 400 ml of a saturated aqueous solution of nickel (II) acetate, and electrolysis was conducted using the base body as the cathode and a nickel plate as the anode. The electrolysis was performed at a voltage of 1.26 to 1.4 V. The obtained reflector was washed with water and dried with air. A 15% aqueous solution of sodium hydroxide was dripped on the protective layer. The reflecting layer was not corroded.

Comparative Example 2

A reflector was prepared in the same manner as in Example 4, except that electrolysis was not performed. When the sodium hydroxide was dripped on the protective layer, the protective layer was peeled off.

EXAMPLE 5

The reflector intermediate product was prepared in the same manner as in Example 1, except that a high-strength aluminum alloy (JIS classification A-3) plate was used instead of the aluminum plate. An epoxy resin was coated on the side faces and the lower surface of the intermediate product, and the resin was cured. Sealing was performed in the same manner as in Example 1. The sealed intermediate product was washed with water and dried with air.

The obtained reflecting mirror was immersed together with a steel plate for 30 minutes in a 15% aqueous solution of hydrochloric acid or in a 15% aqueous solution of sodium hydroxide. The intermediate product was then washed with water and was subjected to the same test as in Example 1 test. The protective layer was not peeled off.

EXAMPLE 6

A reflector was prepared in the same manner as in Example 1 except that an aluminum alloy (JIS classification A-2) plate was used instead of the aluminum plate. An epoxy resin was coated on the peripheral sides of the reflector and the lower surface of the base body and the resin was cured. In the same manner as in Example 5, the reflector was immersed together with a steel plate for 30 minutes in an aqueous solution of 15% hydrochloric acid or in an aqueous solution of 15% sodium hydroxide. The reflecting mirror was then washed with water and was subjected to the same test as in Example 1. The protective layer was not peeled off.

EXAMPLE 7

A desired reflector was prepared in the same manner as in Example 5, except that a heat-resistant aluminum alloy (JIS classification A-4) plate was used instead of high-strength aluminum alloy plate. The reflector was subjected to the same test as in Example 5. The protective layer was not peeled off.

EXAMPLE 8

A smoothing layer and a reflecting layer were formed on the aluminum plate in the same manner as in Example 1. An epoxy resin was coated on the peripheral sides of the smoothing layer and the reflecting layer, and was cured. A protective layer was formed and was sealed in the same manner as in Example 1.

The obtained reflector was subjected to the same test as in Example 1. The protective layer was not peeled off.

EXAMPLE 9

The reflector was prepared in the same manner as in Example 1 except that a high-strength aluminum alloy plate was used instead of the aluminum plate. An acrylic resin was coated on the side faces of the reflector and was cured.

The reflecting mirror was subjected to the same test as in Example 1. The protective layer was not peeled off. The reflector was also subjected to the same test as in Example 5. The protective layer was only partially peeled off.

EXAMPLE 10

The smoothing layer, the reflecting layer and the protective layer were formed on an aluminum plate in the same manner as in Example 1. Cement mortar was coated on the side faces of the smoothing layer, the reflecting layer and the protective layer, and the cement mortar was hardened. The protective layer was sealed in the same manner as in Example 1 to prepare the desired reflector.

The prepared reflector was subjected to the same test as in Example 1. The protective layer was not peeled off. The reflector was also subjected to the same test as in Example 5. The protective layer was partially peeled off. However, when a steel plate was not present, the protective layer was not peeled off.

EXAMPLE 11

The reflectors prepared as in Exmaples 1 to 10, except that the smoothing layer was not formed, were found to have inferior reflectivity to that of the reflector prepared in Examples 1 to 10; however, the resistance to chemicals was substantially the same as that of the reflector prepared in Examples 1 to 10.

EXAMPLE 12

The intermediate product was prepared as in Example 1. The intermediate product was immersed in an aqueous solution obtained by adding 100 ml of distilled water to 100 ml of a saturated aqueous solution of cobalt (II) citrate for 30 minutes. The intermediate product was removed from the solution, washed with distilled water and dried with air to obtain a desired reflector.

The reflector was treated with the aqueous solution of hydrochloric acid and the aqueous solution of sodium hydroxide as in Example 1, and the cellophane tape test was conducted. No fragment of the protective layer was sticked to the tape.

EXAMPLE 13

The intermediate product was prepared as in Example 1. The product was immersed in boiling water for 5 minutes, and was removed from the water. After cooled to room temperature, the product was washed with distilled water and dried with air to obtain a desired reflector.

The reflector was treated with the solution of hydrochloric acid and the solution of sodium hydroxide as in Example 1, and the cellophane tape test was conducted. No fragment of the protective layer was sticked to the tape.

EXAMPLE 14

The intermediate product was prepared as in Example 1. The product was allowed to stand in the saturated water vapor at 200° C. for one minute, and was removed from the water vapor. After cooled to room temperature, the product was washed with distilled water and dried with air.

The reflector was treated with the solution of hydrochloric acid and the solution of sodium hydroxide as in Example 1, and the cellophane tape test was conducted. No fragment of the protective layer was sticked to the tape.

What we claim is:

1. A reflector comprising a base body made of a metallic material having substantially the same ionization potential as that of aluminum, an aluminum reflecting layer vacuum deposited on one surface of said base body directly or through a smoothing layer formed on the base body, a light-transmitting water-formed insoluble inorganic oxide layer directly vacuum deposited on said reflecting layer, and a sealing agent comprising $H_2O$ or a carboxylate of an iron family element having a low valence and sealing micropores of said inorganic oxide layer.

2. A reflector according to claim 1, wherein said reflecting layer is formed on said base body through the smoothing layer.

3. A reflector according to claim 2, wherein said smoothing layer is formed of an inorganic compound or a resin paint.

4. A reflector according to any one of claims 1 to 3, comprising an insulating layer covering peripheral sides of at least said base body and said reflecting layer.

5. A reflector according to claim 4, wherein said insulating layer also covers peripheral side of said smoothing layer.

6. A reflector according to claim 5, wherein said insulating layer also covers a surface of said base body opposite to the surface covered by said aluminum reflecting layer.

7. A reflector according to claim 4, wherein said insulating layer also covers peripheral side of said inorganic oxide layer.

8. A reflector according to claim 1, wherein said reflecting layer has a thickness of 500 to 2,000 Å.

9. A reflector according to claim 1, wherein said inorganic oxide layer has a thickness of 0.5 to 5 μm.

10. A method for manufacturing a reflector comprising the steps of:
(a) forming a reflecting layer by vacuum depositing aluminum directly on one surface of a base body made of a metallic material having substantially the same ionization potential as that of aluminum, or by vacuum depositing aluminum on one surface of said base body through a smoothing layer by vacuum deposition;
(b) forming a light-transmitting protective layer on said reflecting layer by directly depositing a water-insoluble inorganic oxide material thereon to provide an intermediate product; and
(c) sealing micropores of said protective layer by treating with a sealing agent selected from the group consisting of $H_2O$ and a carboxylate of an iron family metal having a low valence.

11. A method according to claim 10, wherein said smoothing layer is formed on the surface of said base body.

12. A method according to claim 10 or 11, further including, between steps (a) and (b), the step of forming an insulating layer which covers pheripheral sides of at least said base body, said smoothing layer and said reflecting layer.

13. A method according to claim 12, wherein said insulating layer covers a surface of said base body opposite to the surface covered by the reflecting layer.

14. A method according to claim 10 or 11, including the step, between steps (b) and (c), of forming an insulating layer which covers pheripheral sides of at least said base body, said smoothing layer, said reflecting layer and said protective layer.

15. A method according to claim 14, wherein said insulating layer also covers a surface of said base body opposite to the surface covered by the reflecting layer.

16. A method according to claim 10 or 11, including the step, after step (c), of forming an insulating layer which covers pheripheral sides of at least said base body, said smoothing layer, said reflecting layer and said protective layer.

17. A method according to claim 16, wherein said insulating layer also covers a surface of said base body opposite to the surface covered by the reflecting layer.

18. A method according to claim 10 or 11, wherein said reflecting layer is formed to a thickness of 500 to 2,000 Å.

19. A method according to claim 10 or 11, wherein said protective layer is formed to a thickness of 0.5 to 5 μm.

20. A method according to claim 10, wherein the step (c) comprises immersing said protective layer in an aqueous solution of the carboxylate under atmospheric pressure or under pressurized conditions at a temperature of 0 to 200° C. for 1 second to 1 hour.

21. A method according to claim 10, wherein the step (c) comprises spraying said protective layer with an aqueous solution of the carboxylate at a temperature of 0° to 200° C.

22. A method according to claim 10, wherein the step (c) comprises conducting electrolysis in an aqueous solution of the carboxylate, using the base body of the intermediate product as a cathode, and a metal piece as an anode which is the same kind as the metal of the carboxylate used.

23. A method according to claim 22, wherein the electrolysis is performed at a voltage of 10 V or less and a current density of 500 mA/cm$^2$ or less for 5 seconds to 1 hour.

24. A method according to any one of claims 10, 20, 21, 22 or 23, wherein a carboxylic acid component of the carboxylate is selected from the group consisting of acetic acid, propionic acid, butyric acid, lactic acid, citric acid, and tartaric acid.

25. A method according to claim 10, wherein the step (c) comprises immersing the protective layer in boiling water at a pH of 5 to 9 for a period of time within 20 minutes.

26. A method according to claim 10, wherein the step (c) comprises allowing the protective layer to stand in a saturated water vapor at a temperature of up to 200° C. for a period of time such that the protective layer is not peeled from the reflecting layer.

27. A method according to claim 26, wherein the step (c) is conducted at 100° C. for 5 to 20 minutes.

28. A method according to claim 26, wherein the step (c) is conducted at 150° C. for 2 to 10 minutes.

29. A method according to claim 26, wherein the step (c) is conducted at 200° C. for 1 to 5 minutes.

* * * * *